US008053301B2

(12) United States Patent
Jaeger et al.

(10) Patent No.: US 8,053,301 B2
(45) Date of Patent: Nov. 8, 2011

(54) CMOS SIGE CHANNEL PFET AND SI CHANNEL NFET DEVICES WITH MINIMAL STI RECESS

(75) Inventors: Daniel J. Jaeger, Wappingers Falls, NY (US); Michael V. Aquilino, Wappingers Falls, NY (US); Christopher V. Baiocco, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 12/413,771

(22) Filed: Mar. 30, 2009

(65) Prior Publication Data

US 2010/0244198 A1    Sep. 30, 2010

(51) Int. Cl.
*H01L 21/8238*    (2006.01)
*H01L 21/20*    (2006.01)

(52) U.S. Cl. ........ 438/199; 438/478; 257/204; 257/351; 257/371; 257/388; 257/412; 257/E27.062

(58) Field of Classification Search .................... 438/199
See application file for complete search history.

(56) References Cited

U.S. PATENT DOCUMENTS

| 7,364,832 | B2 * | 4/2008 | Sun et al. ................... 430/273.1 |
| 7,838,908 | B2 * | 11/2010 | Kwon et al. ................... 257/204 |
| 2001/0015922 | A1 * | 8/2001 | Ponomarev ................... 365/200 |
| 2003/0219938 | A1 * | 11/2003 | Rhee et al. .................... 438/199 |
| 2006/0258073 | A1 * | 11/2006 | Greene et al. ................. 438/199 |
| 2007/0161248 | A1 * | 7/2007 | Christenson et al. ......... 438/689 |
| 2008/0203498 | A1 * | 8/2008 | Takayanagi ................... 257/411 |
| 2009/0191711 | A1 * | 7/2009 | Rui et al. ...................... 438/695 |

* cited by examiner

*Primary Examiner* — N Drew Richards
*Assistant Examiner* — John P Dulka
(74) *Attorney, Agent, or Firm* — Joseph Petrokaiti

(57) ABSTRACT

Silicon germanium (SiGe) is epitaxially grown on a silicon channel above nFET and pFET regions of a substrate. SiGe is removed above the nFET regions. A device includes a silicon channel above the nFET regions and a SiGe channel above the pFET regions.

14 Claims, 7 Drawing Sheets

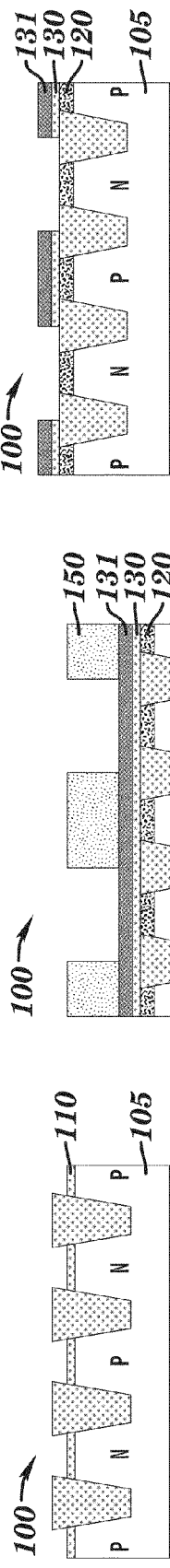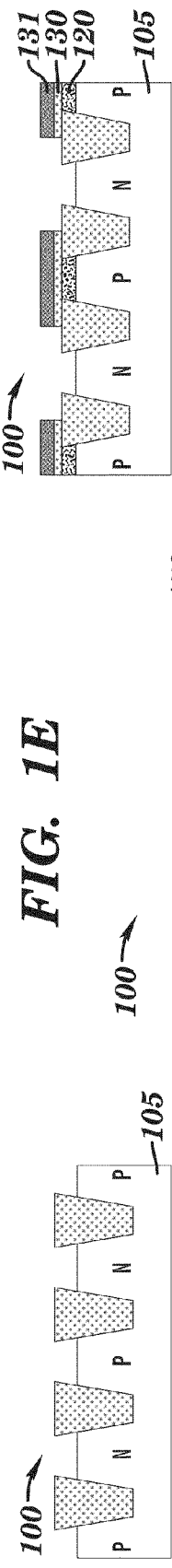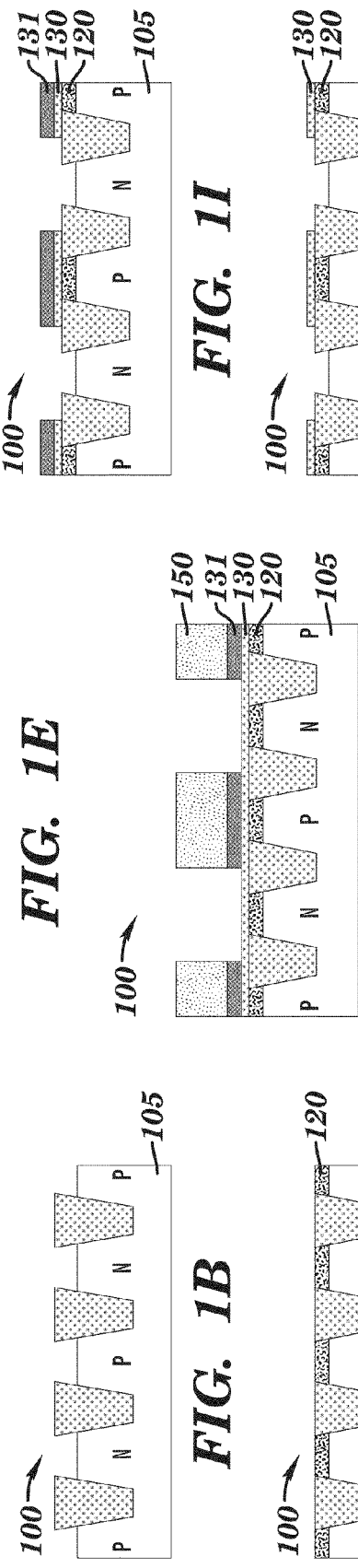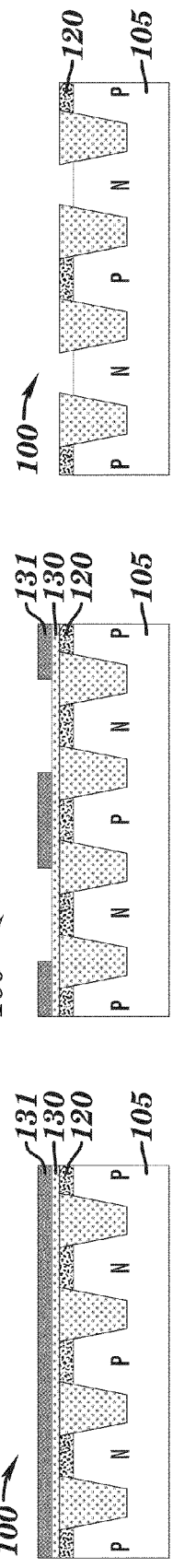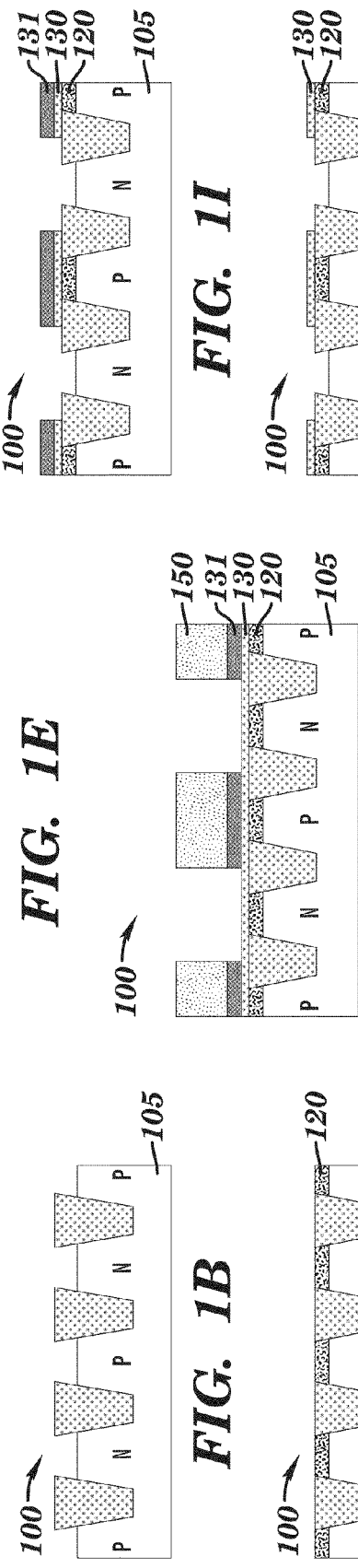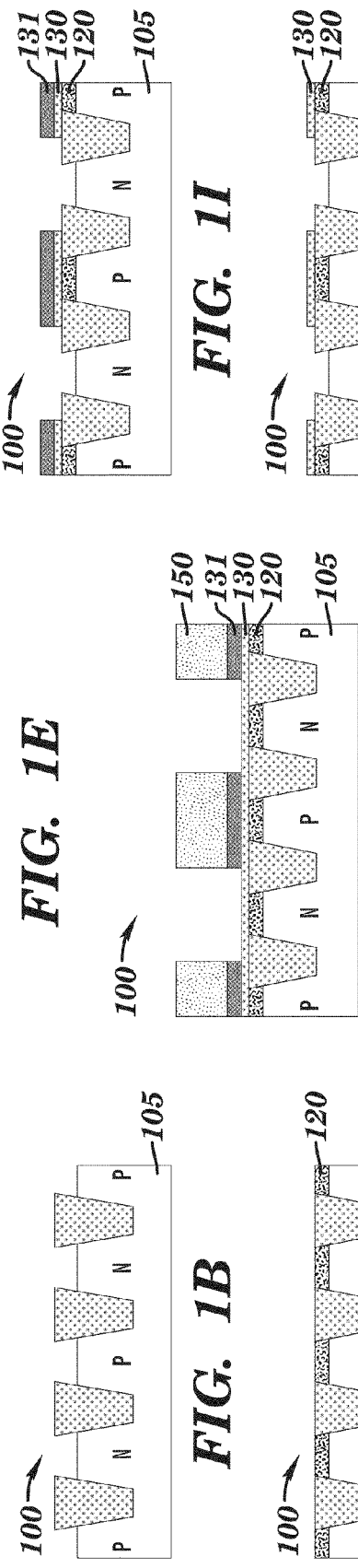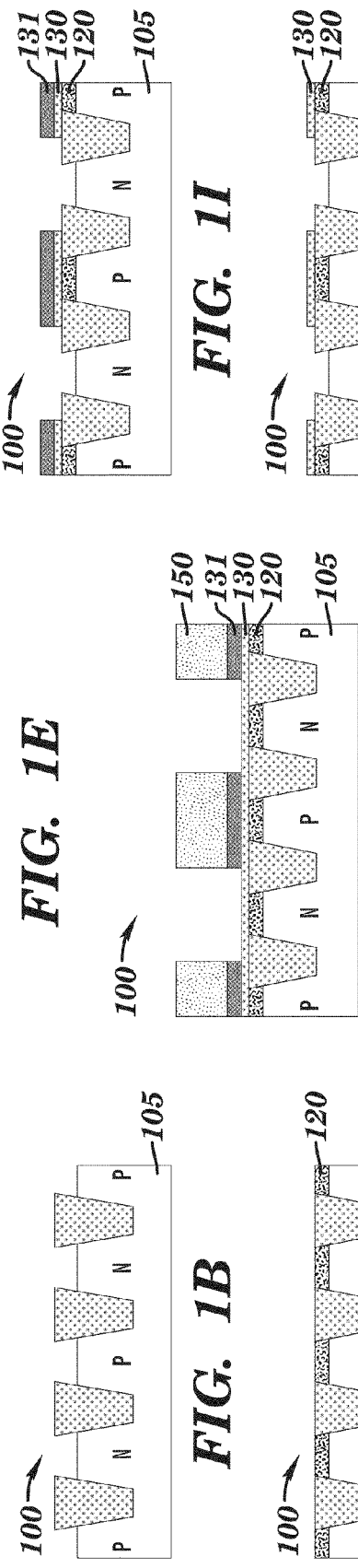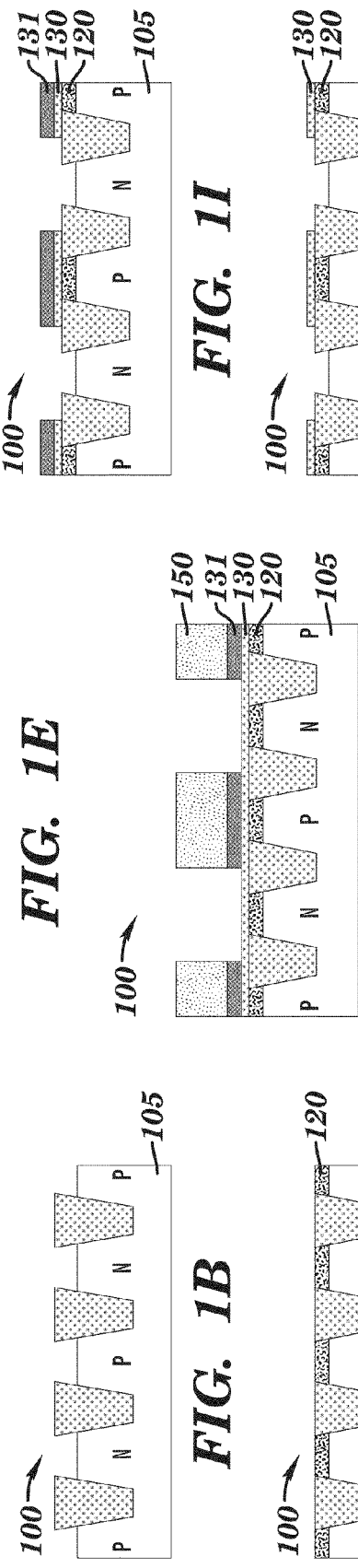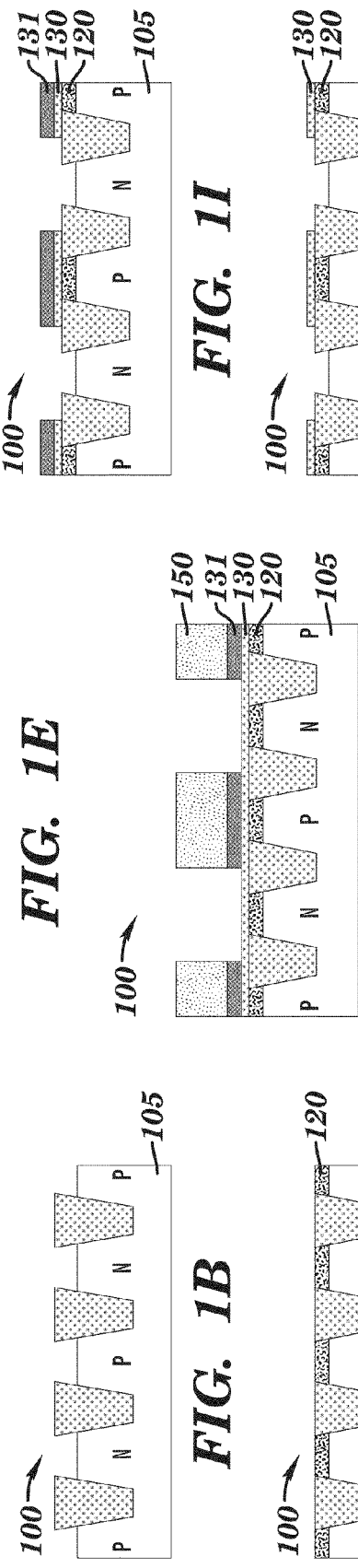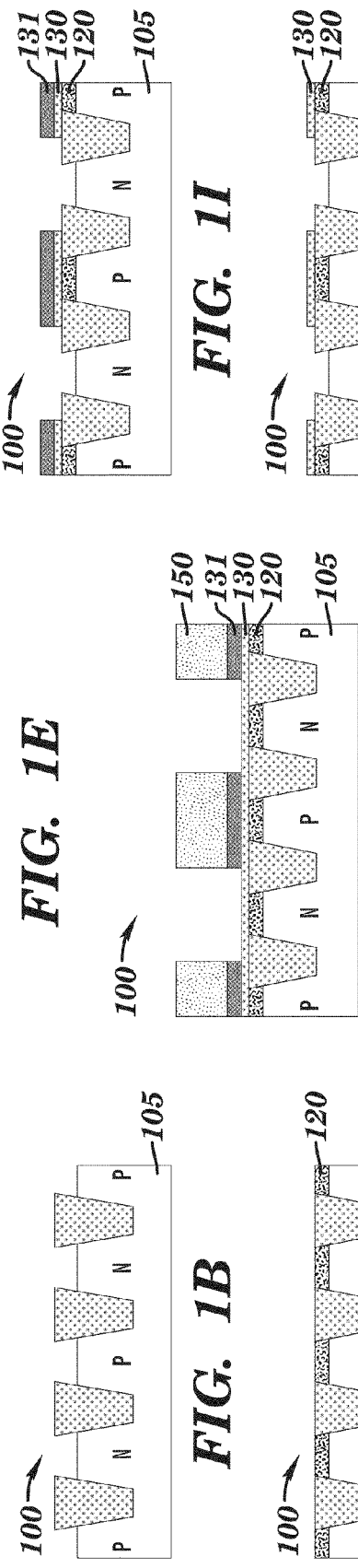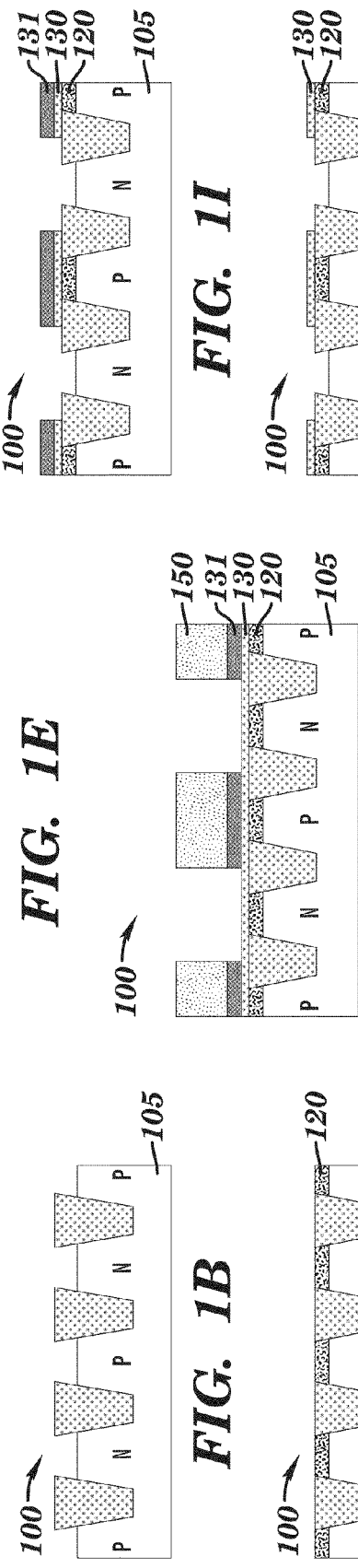

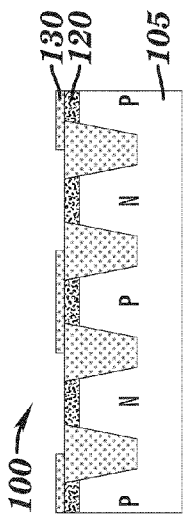
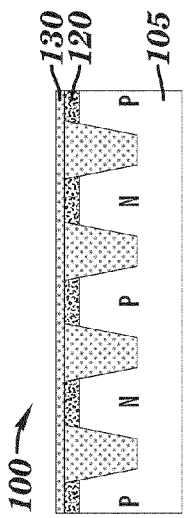
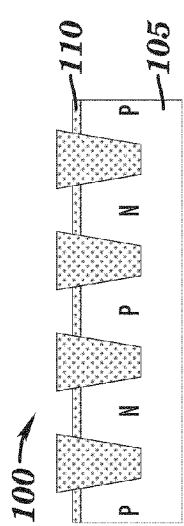
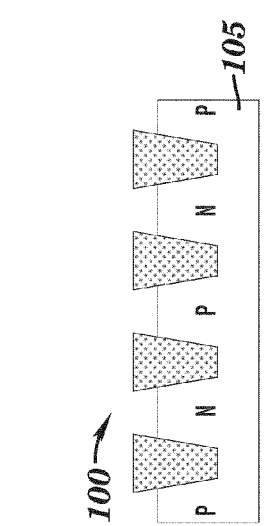
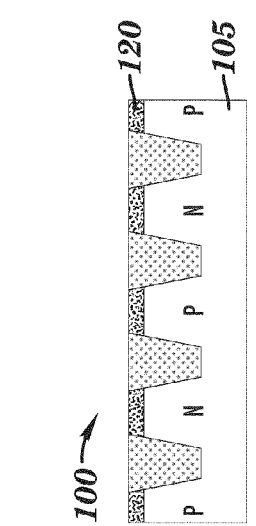
FIG. 2A  FIG. 2D  FIG. 2G
FIG. 2B  FIG. 2E  FIG. 2H
FIG. 2C  FIG. 2F  FIG. 2I

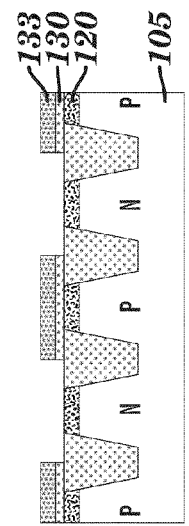
FIG. 3A
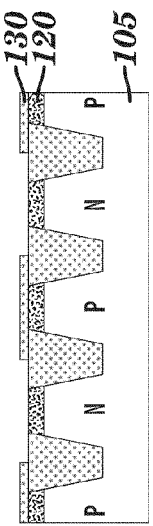
FIG. 3B
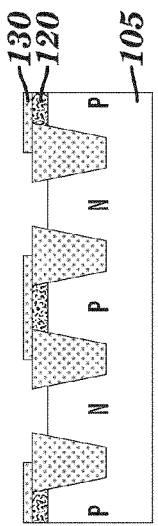
FIG. 3C
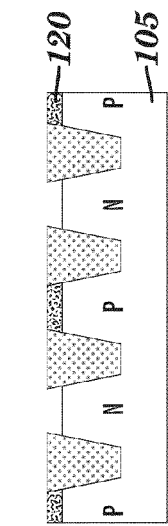
FIG. 3D
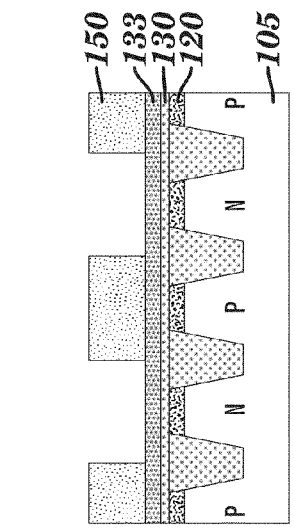
FIG. 3E
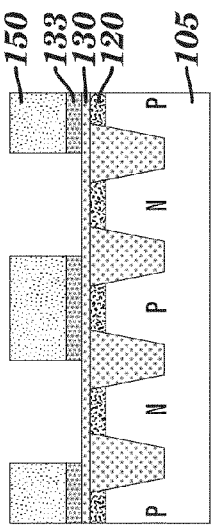
FIG. 3F
FIG. 3G
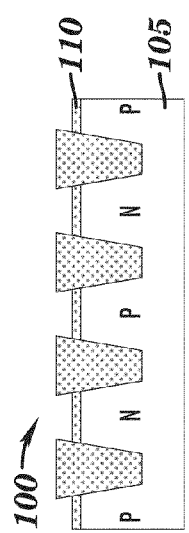
FIG. 3H
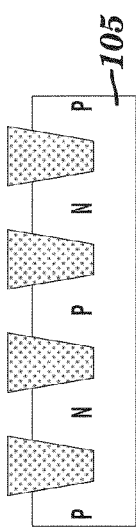
FIG. 3I
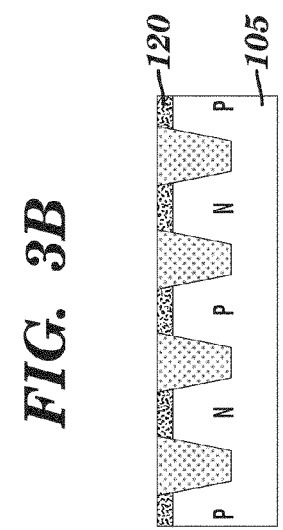
FIG. 3J
FIG. 3K

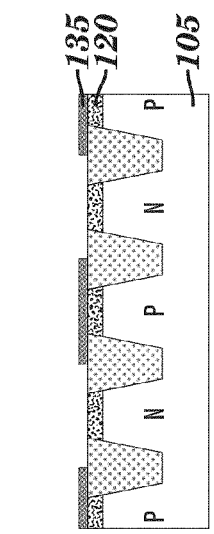
FIG. 5A
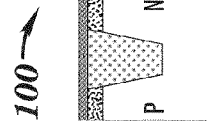
FIG. 5B
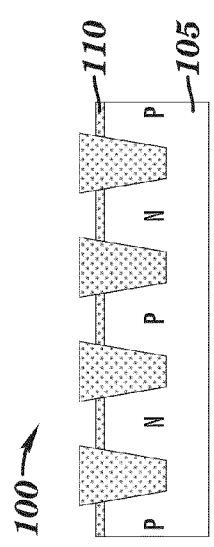
FIG. 5C
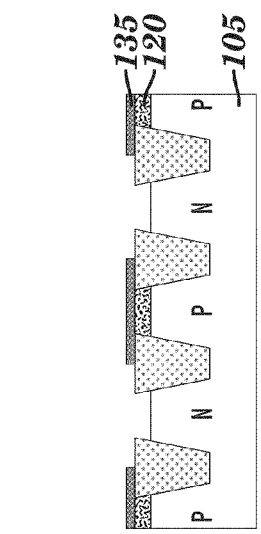
FIG. 5D
FIG. 5E
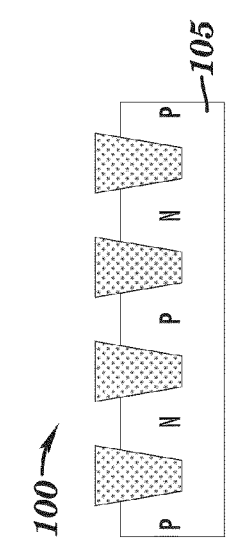
FIG. 5F
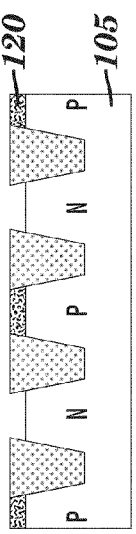
FIG. 5G
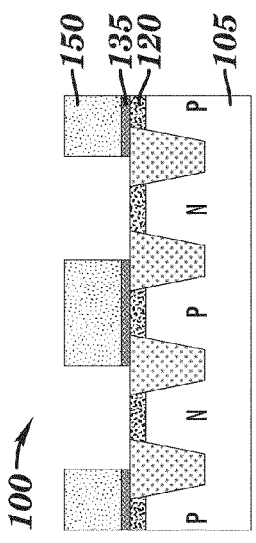
FIG. 5H
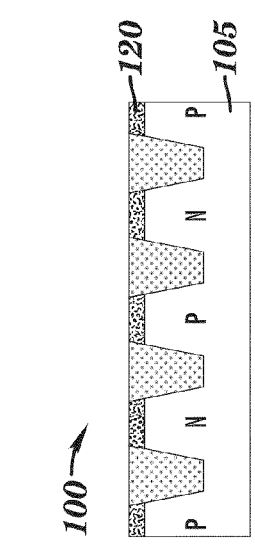
FIG. 5I

CMOS SIGE CHANNEL PFET AND SI CHANNEL NFET DEVICES WITH MINIMAL STI RECESS

BACKGROUND OF THE INVENTION

The present invention relates generally to a semiconductor device and method of forming the same and, more specifically, to CMOS SiGe channel pFET and Si channel nFET devices.

For certain technology node device requirements, it may be necessary to use different channel materials on nFET and pFET devices. The channel materials may be grown using epitaxial growth techniques. In high-k/metal-gate technologies, silicon germanium (SiGe) may be used as the pFET channel material to assist in reaching a desired pFET metal-semiconductor workfunction, while maintaining a traditional silicon channel for the nFET devices. When using epitaxial growth for channel materials on a desired device, a hardmask material such as silicon dioxide (SiO2) or silicon nitride (SiN2) may be used to protect against growth of new channel material on the other devices. The hardmask material is then removed.

Nitride hardmasks are usually not used when growing silicon germanium (SiGe) channel materials. The etchant, such as hot phosphoric acid, used to remove the nitride hardmask also etches the silicon germanium (SiGe) material itself. Patterning of oxide hardmasks with common oxide etchants, such as hydrofluoric acid, also etches the shallow trench isolation (STI) oxide resulting in a different step-height (STI oxide height relative to channel silicon) between nFET and pFET devices. Different size STI divots (amount of STI oxide pulldown immediately next to the active silicon device) may also occur between nFET and pFET devices. Step-height differences and divot differences can create structural topography problems in downstream processing as well as electrical device issues, such as leakage, performance, active width and corner device. A large difference can exist between STI areas and active silicon areas in pFETs versus nFETs. This is all driven by the patterning of the hardmask layer used to protect the nFET device from receiving epitaxial growth. The size of the STI divots near the edge of the active silicon are drastically asymmetrical.

SUMMARY OF THE INVENTION

In a first aspect of the invention, a method of forming a device includes providing a wafer having a pad oxide layer, the wafer including a silicon substrate having nFET regions and pFET regions. The method includes removing the pad oxide layer to expose a silicon channel above the nFET regions and the pFET regions. The method includes growing an epitaxial layer on the silicon channel. The method includes applying a positive photoresist layer on the epitaxial layer above the pFET regions. The method further includes removing the epitaxial layer above the nFET regions. The method also includes removing the positive photoresist layer.

In a further aspect of the invention, a method of forming a device includes the following steps in the order named. The method includes providing a wafer having a pad oxide layer, the wafer including a silicon substrate and having nFET regions and pFET regions. The method includes removing the pad oxide layer to expose a silicon channel above the nFET regions and the pFET regions. The method includes performing a wet oxide etch preclean on the silicon channel. The method includes growing a silicon germanium (SiGe) epitaxial layer on the silicon channel, wherein the silicon germanium (SiGe) epitaxial layer is directly connected to the silicon channel and functions as part of the silicon channel. The method includes depositing a hardmask layer on the silicon germanium (SiGe) epitaxial layer. The method includes applying a positive photoresist layer on the hardmask layer above the pFET regions. The method includes removing the hardmask layer above the nFET regions. The method includes removing the positive photoresist layer. The method further includes removing the silicon germanium (SiGe) epitaxial layer above the nFET regions. The method also includes removing the hardmask layer above the pFET regions.

In a further aspect of the invention, a method of forming a device includes the following steps in the order named. The method includes providing a wafer having a pad oxide layer, the wafer including a silicon substrate and having nFET regions and pFET regions. The method includes removing the pad oxide layer to expose a silicon channel above the nFET regions and the pFET regions. The method includes performing a wet oxide etch preclean on the silicon channel. The method includes growing a silicon germanium (SiGe) epitaxial layer on the silicon channel, wherein the silicon germanium (SiGe) epitaxial layer is directly connected to the silicon channel and functions as part of the silicon channel. The method includes depositing a first hardmask layer on the silicon germanium (SiGe) epitaxial layer. The method includes depositing a second hardmask layer on the first hardmask layer. The method includes applying a positive photoresist layer on the second hardmask layer above the pFET regions. The method includes removing the second hardmask layer above the nFET regions. The method includes removing the positive photoresist layer. The method includes removing the first hardmask layer above the nFET regions. The method includes removing the silicon germanium (SiGe) epitaxial layer above the nFET regions. The method further includes removing the second hardmask layer above the pFET regions. The method also includes removing the first hardmask layer above the pFET regions.

In a yet further aspect of the invention, a device includes a wafer, the wafer having a silicon substrate having nFET regions and pFET regions. The device further includes a silicon channel above the nFET regions. The device also includes an epitaxial layer above the pFET regions.

BRIEF DESCRIPTION OF THE DRAWINGS

The present invention is described in the detailed description below, in reference to the accompanying drawings that depict non-limiting examples of exemplary embodiments of the present invention.

FIGS. 1A-1K show a starting structure, processing steps and a final structure in accordance with a first embodiment of the invention;

FIGS. 2A-2I show a starting structure, processing steps and a final structure in accordance with a second embodiment of the invention;

FIGS. 3A-3K show a starting structure, processing steps and a final structure in accordance with a third embodiment of the invention;

FIGS. 5A-5I show a starting structure, processing steps and a final structure in accordance with a fifth embodiment of the invention.

DETAILED DESCRIPTION OF THE INVENTION

Figure 4A:
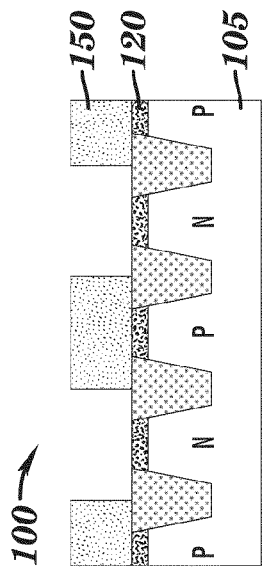
FIGS. 4A-4F show a starting structure, processing steps and a final structure in accordance with a fourth embodiment of the invention.

FIGS. 1A-1K show a starting structure, processing steps and a final structure in accordance with a first embodiment of the invention. Referring to FIG. 1A, a wafer 100 is provided. Wafer 100 includes a silicon substrate 105. Wafer 100 has completed a typical shallow trench isolation (STI) process and through well and channel threshold voltage (Vt) adjustment implantation steps. Wafer 100 has nFET and pFET regions already defined based on well and channel Vt patterning and implantation steps. STI processes consist of forming a pad oxide layer 110 on wafer 100. Pad oxide layer 110 may be a thermal silicon dioxide (SiO2) film. Pad oxide layer 110 may have a thickness of approximately 50 Å to 100 Å. Pad oxide layer 110 protects the silicon channel during STI processing. Pad oxide layer 110 may also be a screening oxide layer for subsequent implantation.

Referring to FIG. 1B, pad oxide layer 110 is removed from wafer 100. Pad oxide layer 110 may be removed by means of a dilute hydrofluoric acid (DHF) wet etch. To ensure complete pad oxide removal, an overetch, typically 30%, may be done such as a 65 Å targeted DHF etch to remove a 50 Å pad oxide. Removing pad oxide layer 110 exposes a silicon channel above the nFET regions and the pFET regions.

An additional wet oxide etch preclean may be performed to further clean the silicon surface of any contaminates. This wet preclean operation may be queue time controlled to the next operation in which an epitaxial layer is grown. The wet preclean ensures proper epitaxial (EPI) growth of the subsequent epitaxial layer.

Referring to FIG. 1C, an epitaxial layer 120 is grown on the exposed silicon channel in both the nFET and the pFET regions of silicon substrate 105. Epitaxial layer 120 may be a thin silicon germanium epitaxial layer. Epitaxial layer 120 may have a thickness of approximately 50 Å to 300 Å.

Referring to FIG. 1D, a first hardmask layer, such as a deposited oxide film 130, is deposited directly on top of silicon germanium (SiGe) epitaxial layer 120. The deposited oxide film may be deposited using various techniques such as rapid thermal chemical vapor deposition (RTCVD), low pressure chemical vapor deposition (LPCVD), sub-atmospheric chemical vapor deposition (SACVD) or atomic layer deposition (ALD). Deposited oxide film 130 may have a thickness of approximately 10 Å to 200 Å; however, subsequent wet etch sequences will be required to fully remove this layer. To minimize the nFET and pFET STI step height offset and to minimize the STI divot, deposited oxide film 130 is preferably as thin as possible, such as 25 Å or less.

A second hardmask layer, such as a silicon nitride film 131, is deposited on top of the deposited oxide film 130. Silicon nitride film 131 may be deposited via low pressure chemical vapor deposition (LPCVD), rapid thermal chemical vapor deposition (RTCVD) or atomic layer deposition (ALD) techniques. Silicon nitride film 131 may have a thickness of approximately 50 Å to 200 Å. An oxygen ashing process may be performed to oxidize the surface of silicon nitride film 131 to prevent resist poisoning.

Silicon nitride film 131 allows for crisp patterning of the underlying deposited oxide film 130 which will later determine the patterning of the channel silicon germanium (SiGe) epitaxial layer 120. In 32 nm technologies and beyond it is common for the nFET and pFET diffusion silicon to only be separated by 70 nm of STI or less. Using resist directly upon the oxide hardmask layer and then patterning it with DHF chemistry results in undercut and loss of pattern fidelity. Implementing a nitride hardmask to enable patterning of the oxide hardmask eliminates the foregoing problems.

Referring to FIG. 1E, a positive photoresist layer 150 is applied on silicon nitride film 131 above the pFET regions. Positive photoresist layer 150 is used to open the nFET regions of substrate 105. Traditional ArF or KrF lithography processes may be used.

Referring to FIG. 1F, a reactive ion etch (RIE) process is utilized to remove silicon nitride film 131 above the nFET regions, stopping on protective deposited oxide film 130.

Referring to FIG. 1G, positive photoresist layer 150 is removed. Positive photoresist layer 150 may be removed using wet resist strip techniques. Sulfuric peroxide and standard clean 1 (SC-1) may be used to remove positive photoresist layer 150.

Referring to FIG. 1H, deposited oxide film 130 protecting the channel silicon germanium (SiGe) epitaxial layer 120 above the nFET regions is removed, exposing the nFET SiGe epitaxial layer 120. In this embodiment the oxide film 130 is etched using a dilute hydrofluoric acid (DHF) wet process. To minimize the N to P STI stepheight delta, this wet etch process can be tuned based upon the composition and density of the oxide film 130.

Referring to FIG. 1I, silicon germanium (SiGe) epitaxial layer 120 above the nFET regions is removed. Silicon germanium (SiGe) epitaxial layer 120 may be etched away using a wet chemistry process. Hot standard clean 1 (SC-1) may be used, such as 65 degree C., NH4OH+H2O2. The time of the etch can be adjusted to ensure full removal of the silicon germanium (SiGe) epitaxial layer based on its thickness and composition. Alternative wet chemistries known to etch silicon germanium (SiGe) may also be used.

Referring to FIG. 1J, silicon nitride layer 131 above the pFET regions may be removed by using a hot phosphoric acid etch. The time of the etch is adjusted to ensure sufficient overetch of the nitride material based on the chosen thickness, composition, and density.

Referring to FIG. 1K, deposited oxide film 130 protecting silicon germanium (SiGe) epitaxial layer 120 above the pFET regions may be removed using a final DHF wet process adjusted for the oxide film's thickness, composition, and density. Depositing silicon germanium (SiGe) in both the nFET and the pFET regions first and then removing the SiGe in the nFET regions results in a structure with silicon germanium (SiGe) channel material in the pFET regions and a silicon (Si) channel in the nFET regions, having minimal STI recess and divot formation. The amount of STI step height difference between nFETs and pFETs can be reduced dramatically, by a factor of 10× or more. The difference between the nFET and pFET STI step heights is almost unnoticeable. The size of the STI divots near the edge of the active silicon are also symmetrical. Having symmetrical STI divots allows for more predictable devices and can minimize topography for downstream photo layers resulting in better process windows at lithography. The lack of topography can also prevent other process issues such as implant shadowing.

FIGS. 2A-2I show a starting structure, processing steps and a final structure in accordance with a second embodiment of the invention. Referring to FIG. 2A, a wafer 100 is provided. Wafer 100 includes a silicon substrate 105. Wafer 100 has completed a typical shallow trench isolation (STI) process and through well and channel threshold voltage (Vt) adjustment implantation steps. Wafer 100 has nFET and pFET regions already defined based on well and channel Vt patterning and implantation steps. STI processes consist of forming a pad oxide layer 110 on wafer 100. Pad oxide layer 110 may be a thermal silicon dioxide (SiO2) film. Pad oxide layer 110 may have a thickness of approximately 50 Å to 100 Å. Pad oxide layer 110 protects the silicon channel during STI processing. Pad oxide layer 110 may also be a screening oxide layer for subsequent implantation.

Referring to FIG. 2B, pad oxide layer 110 is removed from wafer 100. Pad oxide layer 110 may be removed by means of a dilute hydrofluoric acid (DHF) wet etch. To ensure complete pad oxide removal, an overetch, typically 30%, may be done such as a 65 Å targeted DHF etch to remove a 50 Å pad oxide. Removing pad oxide layer 110 exposes a silicon channel above the nFET regions and the pFET regions.

An additional wet oxide etch preclean may be performed to further clean the silicon surface of any contaminates. This wet preclean operation may be queue time controlled to the next operation in which an epitaxial layer is grown. The wet preclean ensures proper epitaxial (EPI) growth of the subsequent epitaxial layer.

Referring to FIG. 2C, a silicon germanium (SiGe) epitaxial layer 120 is grown on the exposed silicon channel in both the nFET and the pFET regions of silicon substrate 105. Silicon germanium (SiGe) epitaxial layer 120 may have a thickness of approximately 50 Å to 300 Å.

Referring to FIG. 2D, a hardmask layer, such as a deposited oxide film 130, is deposited directly on top of silicon germanium (SiGe) epitaxial layer 120. The deposited oxide film may be deposited using various techniques such as rapid thermal chemical vapor deposition (RTCVD), low pressure chemical vapor deposition (LPCVD), sub-atmospheric chemical vapor deposition (SACVD) or atomic layer deposition (ALD). Deposited oxide film 130 may have a thickness of approximately 10 Å to 200 Å; however, subsequent wet etch sequences will be required to fully remove this layer. To minimize the nFET and pFET STI step height offset and to minimize the STI divot, deposited oxide film 130 is preferably as thin as possible, such as 25 Å or less.

Referring to FIG. 2E, a positive photoresist layer 150 is applied on deposited oxide film 130 above the pFET regions. Positive photoresist layer 150 is used to open the nFET regions of substrate 105. Traditional ArF or KrF lithography processes may be used.

Referring to FIG. 2F, deposited oxide film 130 protecting the channel silicon germanium (SiGe) epitaxial layer 120 above the nFET regions is removed, exposing the nFET SiGe epitaxial layer 120. In this embodiment the oxide film 130 is etched using a dilute hydrofluoric acid (DHF) wet process. To minimize the N to P STI stepheight delta, this wet etch process can be tuned based upon the composition and density of the oxide film 130.

Referring to FIG. 2G, positive photoresist layer 150 is removed. Positive photoresist layer 150 may be removed using wet resist strip techniques. Sulfuric peroxide and standard clean 1 (SC-1) may be used to remove positive photoresist layer 150.

Referring to FIG. 2H, silicon germanium (SiGe) epitaxial layer 120 above the nFET regions is removed. Silicon germanium (SiGe) epitaxial layer 120 may be etched away using a wet chemistry process. Hot standard clean 1 (SC-1) may be used, such as 65 degree C., NH4OH+H2O2. The time of the etch can be adjusted to ensure full removal of the silicon germanium (SiGe) epitaxial layer based on its thickness and composition. Alternative wet chemistries known to etch silicon germanium (SiGe) may also be used.

Referring to FIG. 2I, deposited oxide film 130 protecting silicon germanium (SiGe) epitaxial layer 120 above the pFET regions may be removed using a final DHF wet process adjusted for the oxide film's thickness, composition, and density.

FIGS. 3A-3K show a starting structure, processing steps and a final structure in accordance with a third embodiment of the invention. Referring to FIG. 3A, a wafer 100 is provided. Wafer 100 includes a silicon substrate 105. Wafer 100 has completed a typical shallow trench isolation (STI) process and through well and channel threshold voltage (Vt) adjustment implantation steps. Wafer 100 has nFET and pFET regions already defined based on well and channel Vt patterning and implantation steps. STI processes consist of forming a pad oxide layer 110 on wafer 100. Pad oxide layer 110 may be a thermal silicon dioxide (SiO2) film. Pad oxide layer 110 may have a thickness of approximately 50 Å to 100 Å. Pad oxide layer 110 protects the silicon channel during STI processing. Pad oxide layer 110 may also be a screening oxide layer for subsequent implantation.

Referring to FIG. 3B, pad oxide layer 110 is removed from wafer 100. Pad oxide layer 110 may be removed by means of a dilute hydrofluoric acid (DHF) wet etch. To ensure complete pad oxide removal, an overetch, typically 30%, may be done such as a 65 Å targeted DHF etch to remove a 50 Å pad oxide. Removing pad oxide layer 110 exposes a silicon channel above the nFET regions and the pFET regions.

An additional wet oxide etch preclean may be performed to further clean the silicon surface of any contaminates. This wet preclean operation may be queue time controlled to the next operation in which an epitaxial layer is grown. The wet preclean ensures proper epitaxial (EPI) growth of the subsequent epitaxial layer.

Referring to FIG. 3C, an epitaxial layer 120 is grown on the exposed silicon channel in both the nFET and the pFET regions of silicon substrate 105. Epitaxial layer 120 may be a thin silicon germanium epitaxial layer. Epitaxial layer 120 may have a thickness of approximately 50 Å to 300 Å.

Referring to FIG. 3D, a hardmask layer, such as a deposited oxide film 130, is deposited directly on top of silicon germanium (SiGe) epitaxial layer 120. The deposited oxide film may be deposited using various techniques such as rapid thermal chemical vapor deposition (RTCVD), low pressure chemical vapor deposition (LPCVD), sub-atmospheric chemical vapor deposition (SACVD) or atomic layer deposition (ALD). Deposited oxide film 130 may have a thickness of approximately 10 Å to 200 Å; however, subsequent wet etch sequences will be required to fully remove this layer. To minimize the nFET and pFET STI step height offset and to minimize the STI divot, deposited oxide film 130 is preferably as thin as possible, such as 25 Å or less.

An additional patterning silicon hardmask layer, such as a poly-silicon or amorphous silicon film 133, is deposited on top of deposited oxide film 130. Silicon film 133 may be deposited via low pressure chemical vapor deposition (LPCVD), single-wafer rapid thermal chemical vapor deposition (RTCVD) or atomic layer deposition (ALD) techniques. Silicon film 133 may have a thickness of approximately 100 Å to 300 Å. Silicon film 133 allows for crisp patterning of the underlying deposited oxide film 130 which will later determine the patterning of the channel silicon germanium (SiGe) epitaxial layer 120.

Referring to FIG. 3E, a positive photoresist layer 150 is applied on silicon film 133 above the pFET regions. Positive photoresist layer 150 is used to open the nFET regions of substrate 105. Traditional ArF or KrF lithography processes may be used.

Referring to FIG. 3F, a reactive ion etch (RIE) process is utilized to remove silicon film 133 above the nFET regions, stopping on protective deposited oxide film 130.

Referring to FIG. 3G, positive photoresist layer 150 is removed. Positive photoresist layer 150 may be removed using wet resist strip techniques. Sulfuric peroxide and standard clean 1 (SC-1) may be used to remove positive photoresist layer 150.

Referring to FIG. 3H, deposited oxide film 130 protecting the channel silicon germanium (SiGe) epitaxial layer 120 above the nFET regions is removed, exposing the nFET SiGe epitaxial layer 120. In this embodiment the oxide film 130 is etched using a dilute hydrofluoric acid (DHF) wet process. To minimize the N to P STI stepheight delta, this wet etch process can be tuned based upon the composition and density of the oxide film 130.

Referring to FIG. 3I, silicon film 133 above the pFET regions may be removed by using hot NH4OH chemistry. Alternative wet etch chemistries known to etch silicon may be used instead. The time of the etch is adjusted to ensure sufficient overetch of the silicon material based on the chosen thickness.

Referring to FIG. 3J, silicon germanium (SiGe) epitaxial layer 120 above the nFET regions is removed. Silicon germanium (SiGe) epitaxial layer 120 may be etched away using a wet chemistry process. Hot standard clean 1 (SC-1) may be used, such as 65 degree C., NH4OH+H2O2. The time of the etch can be adjusted to ensure full removal of the silicon germanium (SiGe) epitaxial layer based on its thickness and composition. Alternative wet chemistries known to etch silicon germanium (SiGe) may also be used.

Referring to FIG. 3K, deposited oxide film 130 protecting silicon germanium (SiGe) epitaxial layer 120 above the pFET regions may be removed using a final DHF wet process adjusted for the oxide film's thickness, composition, and density.

FIGS. 4A-4F show a starting structure, processing steps and a final structure in accordance with a fourth embodiment of the invention. Referring to FIG. 4A, a wafer 100 is provided. Wafer 100 includes a silicon substrate 105. Wafer 100 has completed a typical shallow trench isolation (STI) process and through well and channel threshold voltage (Vt) adjustment implantation steps. Wafer 100 has nFET and pFET regions already defined based on well and channel Vt patterning and implantation steps. STI processes consist of forming a pad oxide layer 110 on wafer 100. Pad oxide layer 110 may be a thermal silicon dioxide (SiO2) film. Pad oxide layer 110 may have a thickness of approximately 50 Å to 100 Å. Pad oxide layer 110 protects the silicon channel during STI processing. Pad oxide layer 110 may also be a screening oxide layer for subsequent implantation.

Figure 4B:
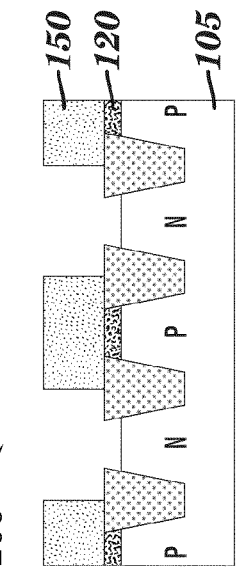

Referring to FIG. 4B, pad oxide layer 110 is removed from wafer 100. Pad oxide layer 110 may be removed by means of a dilute hydrofluoric acid (DHF) wet etch. To ensure complete pad oxide removal, an overetch, typically 30%, may be done such as a 65 Å targeted DHF etch to remove a 50 Å pad oxide. Removing pad oxide layer 110 exposes a silicon channel above the nFET regions and the pFET regions.

An additional wet oxide etch preclean may be performed to further clean the silicon surface of any contaminates. This wet preclean operation may be queue time controlled to the next operation in which an epitaxial layer is grown. The wet preclean ensures proper epitaxial (EPI) growth of the subsequent epitaxial layer.

Figure 4C:
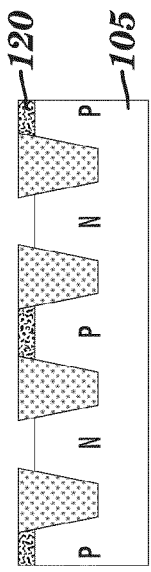

Referring to FIG. 4C, an epitaxial layer 120 is grown on the exposed silicon channel in both the nFET and the pFET regions of silicon substrate 105. Epitaxial layer 120 may be a thin silicon germanium epitaxial layer. Epitaxial layer 120 may have a thickness of approximately 50 Å to 300 Å.

Figure 4D:
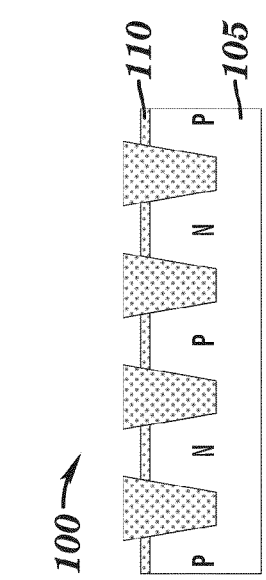

Referring to FIG. 4D, a positive photoresist layer 150 is applied on epitaxial layer 120 above the pFET regions. Positive photoresist layer 150 is used to open the nFET regions of substrate 105. Traditional ArF or KrF lithography processes may be used. An alternative to using a simple photoresist is to use a developable bottom anti-reflective coating (DBARC) in addition to the photoresist.

Figure 4E:
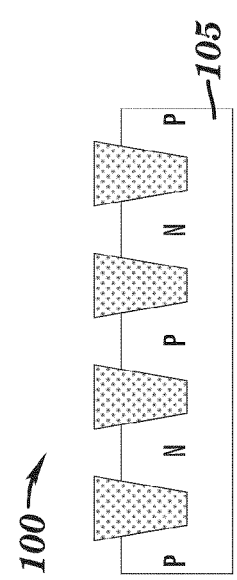

Referring to FIG. 4E, epitaxial layer 120 above the nFET regions is removed. Epitaxial layer 120 may be etched away using a wet etch chemistry process. Hot standard clean 1 (SC-1) may be used, such as 65 degree C., NH4OH+H2O2, to etch silicon germanium (SiGe). Alternative etches may be used to ensure good selectivity between the silicon germanium (SiGe) and the photoresist or the developable bottom anti-reflective coating (DBARC) and the photoresist.

Figure 4F:
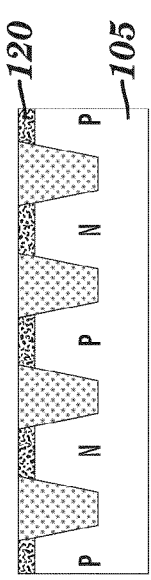
Figure 6:
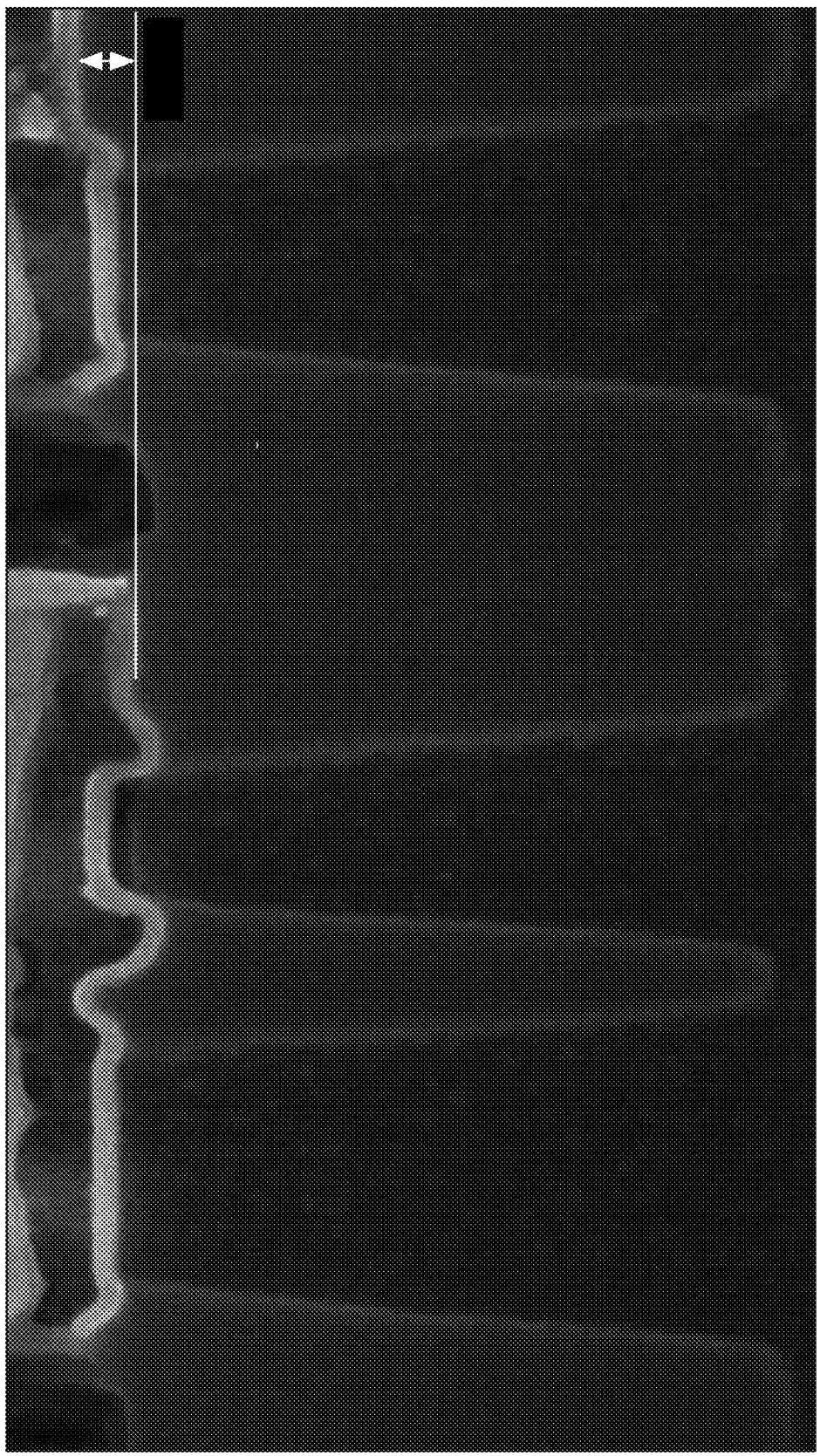
FIG. 6 is a TEM image of a CMOS SiGe channel pFET and Si channel nFET device manufactured according to the prior art and processed through gate deposition and patterning.
Figure 7:
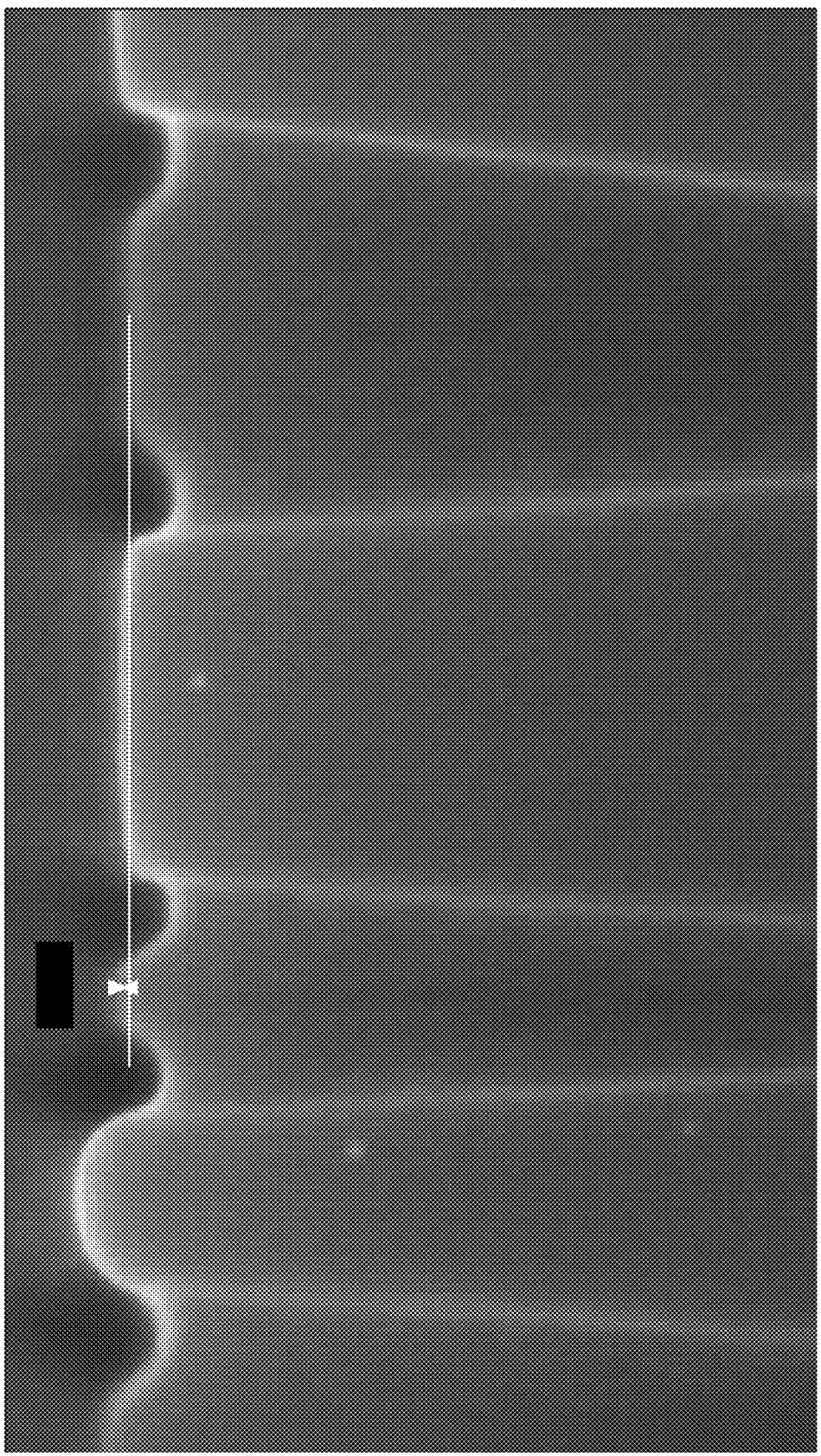
FIG. 7 is a TEM image of a CMOS SiGe channel pFET and Si channel nFET device manufactured according to an embodiment of the invention and processed through epitaxial channel deposition and patterning.

Referring to FIG. 4F, positive photoresist layer 150 is removed. Positive photoresist layer 150 may be removed using wet resist strip techniques. Sulfuric peroxide and standard clean 1 (SC-1) may be used to remove positive photoresist layer 150.

FIGS. 5A-5I show a starting structure, processing steps and a final structure in accordance with a fifth embodiment of the invention. Referring to FIG. 5A, a wafer 100 is provided. Wafer 100 includes a silicon substrate 105. Wafer 100 has completed a typical shallow trench isolation (STI) process and through well and channel threshold voltage (Vt) adjustment implantation steps. Wafer 100 has nFET and pFET regions already defined based on well and channel Vt patterning and implantation steps. STI processes consist of forming a pad oxide layer 110 on wafer 100. Pad oxide layer 110 may be a thermal silicon dioxide (SiO2) film. Pad oxide layer 110 may have a thickness of approximately 50 Å to 100 Å. Pad oxide layer 110 protects the silicon channel during STI processing. Pad oxide layer 110 may also be a screening oxide layer for subsequent implantation.

Referring to FIG. 5B, pad oxide layer 110 is removed from wafer 100. Pad oxide layer 110 may be removed by means of a dilute hydrofluoric acid (DHF) wet etch. To ensure complete pad oxide removal, an overetch, typically 30%, may be done such as a 65 Å targeted DHF etch to remove a 50 Å pad oxide. Removing pad oxide layer 110 exposes a silicon channel above the nFET regions and the pFET regions.

An additional wet oxide etch preclean may be performed to further clean the silicon surface of any contaminates. This wet preclean operation may be queue time controlled to the next operation in which an epitaxial layer is grown. The wet preclean ensures proper epitaxial (EPI) growth of the subsequent epitaxial layer.

Referring to FIG. 5C, an epitaxial layer 120 is grown on the exposed silicon channel in both the nFET and the pFET regions of silicon substrate 105. Epitaxial layer 120 may be a thin silicon germanium epitaxial layer. Epitaxial layer 120 may have a thickness of approximately 50 Å to 300 Å.

Referring to FIG. 5D, a nitride hardmask layer, such as a silicon nitride film 135 is deposited directly on top of silicon germanium (SiGe) epitaxial layer 120. Silicon nitride film 135 may be deposited via low pressure chemical vapor deposition (LPCVD), rapid thermal chemical vapor deposition (RTCVD) or atomic layer deposition (ALD) techniques. Silicon nitride film 135 may have a thickness of approximately 50 Å to 200 Å. An oxygen ashing process may be performed to oxidize the surface of silicon nitride film 135 to prevent resist poisoning.

Referring to FIG. 5E, a positive photoresist layer 150 is applied on nitride hardmask layer 135 above the pFET regions. Positive photoresist layer 150 is used to open the nFET regions of substrate 105. Traditional ArF or KrF lithography processes may be used.

Referring to FIG. 5F, nitride hardmask layer 135 protecting the channel silicon germanium (SiGe) epitaxial layer 120 above the nFET regions is removed, exposing the nFET SiGe epitaxial layer 120. Nitride hardmask layer 135 may be removed via reactive ion etch (RIE) or wet chemistry that etches nitride selective to resist, such as hydrofluoric ethylene glycol (HFEG).

Referring to FIG. 5G, positive photoresist layer 150 is removed. Positive photoresist layer 150 may be removed using wet resist strip techniques. Sulfuric peroxide and standard clean 1 (SC-1) may be used to remove positive photoresist layer 150.

Referring to FIG. 5H, epitaxial layer 120 above the nFET regions is removed. Epitaxial layer 120 may be etched away using a wet etch chemistry process. Hot standard clean 1 (SC-1) may be used, such as 65 degree C., NH4OH+H2O2, to etch silicon germanium (SiGe). The time of the etch can be adjusted to ensure full removal of the silicon germanium (SiGe) epitaxial layer based on its thickness and composition. Alternative wet chemistries known to etch silicon germanium (SiGe) and may also be used.

Referring to FIG. 5I, nitride hardmask layer 135 protecting silicon germanium (SiGe) epitaxial layer 120 above the pFET regions is removed. A hot phosphoric acid etch or HFEG etch may be used to remove nitride hardmask layer 135.

The method as described above is used in the fabrication of integrated circuit chips. The resulting integrated circuit chips can be distributed by the fabricator in raw wafer form (that is, as a single wafer that has multiple unpackaged chips), as a bare die or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a device, comprising the following steps in the order named:
   providing a wafer having a pad oxide layer, the wafer including a silicon substrate and having nFET regions and pFET regions;
   removing the pad oxide layer to expose a silicon channel above the nFET regions and the pFET regions;
   performing a wet oxide etch preclean on the silicon channel;
   growing a silicon germanium (SiGe) epitaxial layer on the silicon channel, wherein the silicon germanium (SiGe) epitaxial layer is directly connected to the silicon channel and functions as part of the silicon channel;
   depositing a hardmask layer on the silicon germanium (SiGe) epitaxial layer;
   applying a positive photoresist layer on the hardmask layer above the pFET regions;
   removing the hardmask layer above the nFET regions;
   removing the positive photoresist layer;
   removing the silicon germanium (SiGe) epitaxial layer above the nFET regions; and
   removing the hardmask layer above the pFET regions.

2. A method according to claim 1, wherein the hardmask layer comprises a deposited oxide film.

3. A method according to claim 2, wherein the deposited oxide film is deposited by rapid thermal chemical vapor deposition (RTCVD), low pressure chemical vapor deposition (LPCVD), sub-atmospheric chemical vapor deposition (SACVD) or atomic layer deposition (ALD).

4. A method according to claim 3, wherein the deposited oxide film has a thickness of approximately 10 Å to 200 Å.

5. A method according to claim 1, wherein the hardmask layer comprises a nitride hardmask.

6. A method according to claim 5, wherein the nitride hardmask is deposited by low pressure chemical vapor deposition (LPCVD), rapid thermal chemical vapor deposition (RTCVD) or atomic layer deposition (ALD).

7. A method of forming a device, comprising the following steps in the order named:
   providing a wafer having a pad oxide layer, the wafer including a silicon substrate and having nFET regions and pFET regions;
   removing the pad oxide layer to expose a silicon channel above the nFET regions and the pFET regions;
   performing a wet oxide etch preclean on the silicon channel;
   growing a silicon germanium (SiGe) epitaxial layer on the silicon channel, wherein the silicon germanium (SiGe) epitaxial layer is directly connected to the silicon channel and functions as part of the silicon channel;
   depositing a first hardmask layer on the silicon germanium (SiGe) epitaxial layer;
   depositing a second hardmask layer on the first hardmask layer;
   applying a positive photoresist layer on the second hardmask layer above the pFET regions;
   removing the second hardmask layer above the nFET regions;
   removing the positive photoresist layer;
   removing the first hardmask layer above the nFET regions;
   removing the silicon germanium (SiGe) epitaxial layer above the nFET regions;
   removing the second hardmask layer above the pFET regions; and
   removing the first hardmask layer above the pFET regions.

8. A method according to claim 7, wherein the first hardmask layer comprises a deposited oxide film.

9. A method according to claim 7, wherein the second hardmask layer comprises a silicon nitride film.

10. A method according to claim 9, wherein the silicon nitride film is deposited via low pressure chemical vapor deposition (LPCVD), rapid thermal chemical vapor deposition (RTCVD) or atomic layer deposition (ALD).

11. A method according to claim 10, wherein the silicon nitride film has a thickness of approximately 50 to 200 Å.

12. A method according to claim 7, wherein the second hardmask layer comprises a poly-silicon or an amorphous silicon film.

13. A method according to claim 12, wherein the silicon film is deposited via low pressure chemical vapor deposition (LPCVD), rapid thermal chemical vapor deposition (RTCVD) or atomic layer deposition (ALD).

14. A method according to claim 12, wherein the silicon film has a thickness of approximately 100 Å to 300 Å.

* * * * *